(12) United States Patent
Towns et al.

(10) Patent No.: US 6,423,428 B1
(45) Date of Patent: Jul. 23, 2002

(54) CONJUGATED COPOLYMERS FOR USE IN LUMINESCENT DEVICES

(75) Inventors: Carl Towns, Crown Cottage; Ilaria Grizzi, Walthamstow, both of (GB)

(73) Assignee: Cambridge Display Technology Limited (GB)

( * ) Notice: Subject to any disclaimer, the term of this patent is extended or adjusted under 35 U.S.C. 154(b) by 0 days.

(21) Appl. No.: 09/230,374

(22) PCT Filed: Jul. 29, 1997

(86) PCT No.: PCT/GB97/02038

§ 371 (c)(1),
(2), (4) Date: Mar. 19, 1999

(87) PCT Pub. No.: WO98/04610

PCT Pub. Date: Feb. 5, 1998

(30) Foreign Application Priority Data

| Jul. 29, 1996 | (GB) | 9615883 |
| Sep. 17, 1996 | (GB) | 9619382 |
| Sep. 28, 1996 | (GB) | 9620271 |
| Oct. 30, 1996 | (GB) | 9622572 |
| Nov. 28, 1996 | (GB) | 9624707 |
| Feb. 15, 1997 | (GB) | 9703172 |

(51) Int. Cl.[7] .................. B32B 19/00; C09K 11/02
(52) U.S. Cl. ............... 428/690; 528/373; 528/374; 528/380; 528/391; 528/481; 528/502; 528/503; 524/401; 428/457; 428/463; 428/500; 428/521; 428/524; 252/301.16; 252/500; 252/301.35; 385/141; 385/143; 385/145
(58) Field of Search .................... 528/373, 374, 528/380, 391, 481, 502, 503; 524/401; 428/457, 403, 500, 521, 524, 690; 252/500, 301.16, 301.35; 385/141, 143, 145

(56) References Cited

U.S. PATENT DOCUMENTS 4,900,782 A    2/1990  Han et al. .................. 525/398

(List continued on next page.)

FOREIGN PATENT DOCUMENTS

| EP | 0443 861 A2 | 8/1991 |
| JP | 6231881 | 8/1994 |

(List continued on next page.)

*Primary Examiner*—Samuel A. Acquah
(74) *Attorney, Agent, or Firm*—Finnegan, Henderson, Farabow, Garrett & Dunner (57) ABSTRACT

A process for the preparation of a conjugated poly(arylene vinylene) copolymer for use in a luminescent device, which comprises: (1) providing a precursor polymer comprising units of general formula

$$-(ArCHR^1-CR^2L)_n-,$$

in which Ar is substituted or unsubstituted arylene, L is a leaving group, $R^1$ and $R^2$ are each independently H, alkyl, alkoxy, aryl or an electron-withdrawing group, and n is an integer; (2) reacting the precursor polymer with a reactant comprising a carboxylate, an aldehyde, a ketone, a sulphonate, a thioate, a disulphide, a xanthate, an amine, a pyridine, a hydrazide, a phenoxide, an alcohol with a boiling point above 100° C., or a derivative thereof, under substitution conditions whereby a proportion of the leaving groups are substituted to form a substituted precursor copolymer comprising units of general formula $$-(ArCHR^1-CR^2L)_m- \quad -(ArCHR^1-CR^2X)_l-,$$

in which Ar, $R_1$, $R^2$ and L are defined above, X is a substituent group from the reactant, l and m are independently integers; and (3) converting the substituted precursor copolymer to a conjugated poly(arylene vinylene) copolymer by elimination of the leaving groups from the substituted precursor copolymer.

24 Claims, 2 Drawing Sheets p-Xylenebis(tetrahydrothiopheniumhalide)

PPV

U.S. PATENT DOCUMENTS 5,401,827 A * 3/1995 Holmes et al. ............. 528/374
5,425,125 A * 6/1995 Holmes et al. ............. 385/143

FOREIGN PATENT DOCUMENTS

| WO | WO 92/03491 | 5/1992 |
| WO | WO 93/14177 | 7/1993 |

* cited by examiner

CONJUGATED COPOLYMERS FOR USE IN LUMINESCENT DEVICES

FIELD OF THE INVENTION

This invention relates to conjugated polymers for use in luminescent devices, especially electroluminescent devices, and their synthesis.

BACKGROUND TO THE INVENTION

Figure 1:
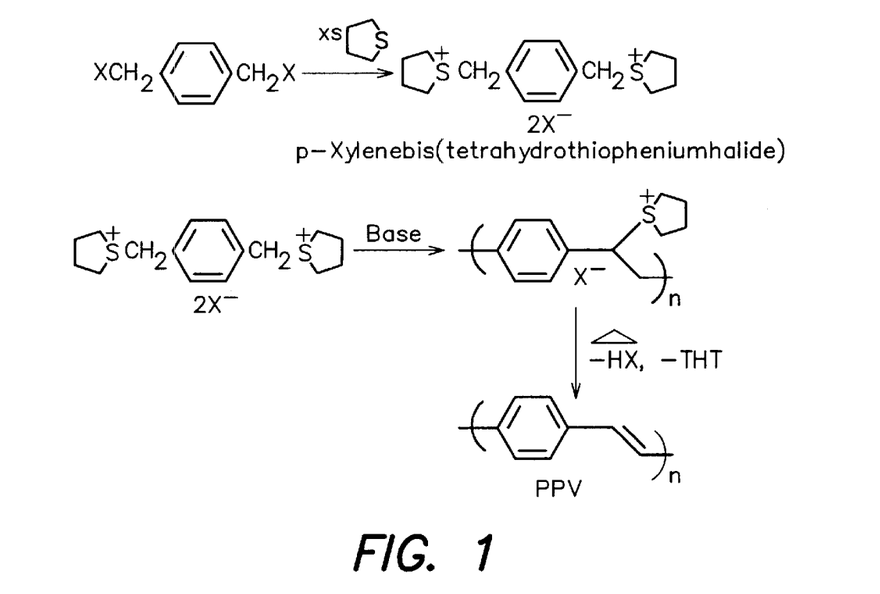
FIG. 1 shows in outline a standard precursor approach to the production of PPV.
Figure 2:
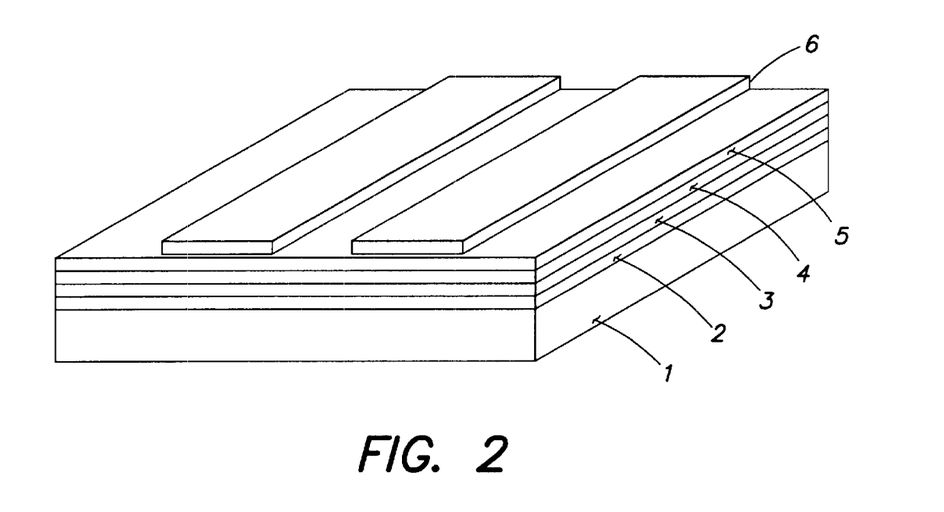
FIG. 2 shows a typical structure for an electroluminescent device.

Conjugated polymers have been used as organic electroluminescent (EL) materials in suitable device structures, as demonstrated in our earlier patent herein incorporated by reference as U.S. Pat. No. 5,399,502. Poly(p-phenylene vinylene) is one such polymer and may be prepared via the Wessling precursor method as described in, for example "Precursor Route to Poly(p-phenylene vinylene): Polymer Characterisation and Control of Electronic Properties" D. D. C. Bradley, J. Phys. D. 20, 1389 (1987). For example, a tetrahydrothiophene-based precursor with a halide counter-ion is typically used as shown in FIG. 1. It has been proposed that the polymerisation of the p-xylenebis(sulphonium halide) monomer occurs via a quinoid intermediate as described in "The Polymerisation of Xylylene Bisdialkyl Sulfonium Salts" R. A. Wessling, J. Pol. Sci. Pol. Symp. 72, 55–66, (1985). The conjugated polymer formed is insoluble and intractable and therefore the solution processable precursor is required. Device fabrication is carried out using the precursor material and the conjugated polymer is prepared in situ via a thermal conversion step. Typically, the precursor polymer is coated, by spin-coating or blade coating or other coating techniques, onto a transparent conductive oxide layer, for example Indium Tin Oxide (ITO). The ITO is itself coated onto a suitable substrate which may be, for example, glass or plastic. The precursor polymer film is then converted on the ITO by suitable heat treatment. Following this, appropriate metal electrodes are deposited. A multi-layer structure is therefore obtained which consists of an anode, the conjugated polymer, and the cathode. Injection of positive and negative charge carriers at the anode and cathode respectively leads to light emission. Other layers may be included into the device to facilitate charge injection/accumulation or to afford protection during the conversion process. This is shown in FIG. 2.

The advantages of using precursor conjugated polymers as emissive layers in EL devices include:

a) ease of fabrication, b) amenable to multilayer structures, c) intractability of converted polymer film, and d) intrinsic luminescence properties.

Figure 3:
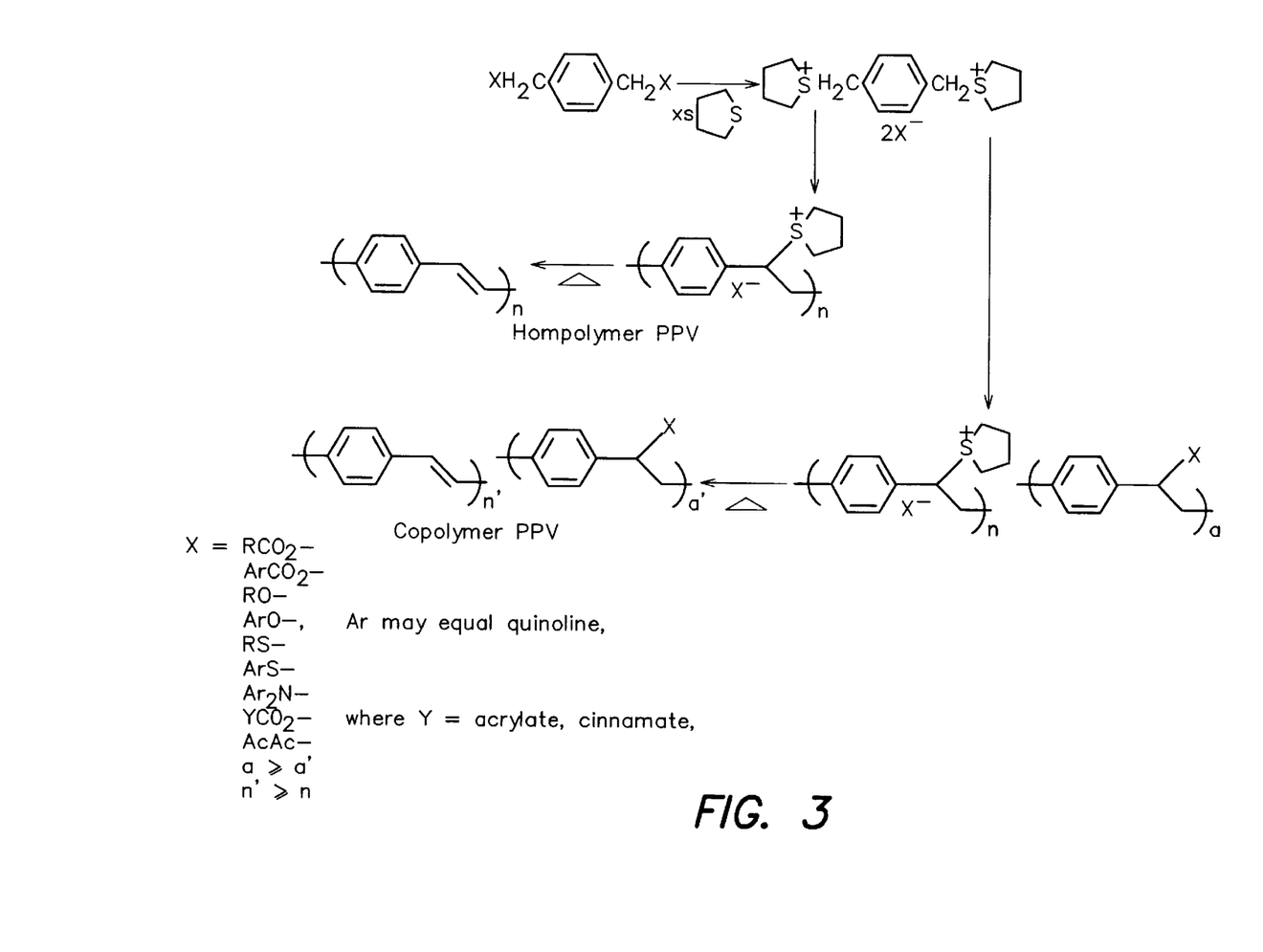
FIG. 3 shows a reaction scheme in accordance with the present invention.

However, there is some evidence that the quantum yield for radiative decay of the excited states is lowered through their migration to non-radiative decay centres hence photoluminescence and therefore electroluminescence efficiencies are significantly reduced. Our previous patent, herein incorporated by reference as U.S. Pat. No. 5,401,827 has dealt with this issue by describing a semiconductive conjugated copolymer comprising at least two chemically different repeat units with different semiconductor band gaps (for example conjugated and non-conjugated segments). The optical properties of the copolymer are therefore determined by the relative proportions of the different repeat units. Copolymers were prepared in this work either by copolymerisation of more than one bis(sulphonium) salt, control of the degree of conversion of the precursor polymer, or by the substitution of the THT unit to provide groups that would survive the conversion process. The latter approach is shown in FIG. 3 and will henceforth be referred to as the Substitution Approach.

We now have evidence that conversion of precursor homopolymer or copolymer systems on certain conductive oxide substrates such as ITO, can lead to undesirable interactions that give rise to either quenching of luminescence or to modification of the expected copolymer composition. Furthermore, we have observed that the presence of certain functional groups in the copolymer can be detrimental to device performance, and in particular to device lifetime.

SUMMARY OF THE INVENTION

The present invention seeks to provide conjugated arylene vinylene copolymer systems prepared via the precursor approach as emissive layers in EL devices which overcome these difficulties and retain the benefit of enhanced photoluminescence and electroluminescence efficiency.

The present invention provides a process for the preparation of a conjugated poly(arylene vinylene) copolymer for use in a luminescent device, which comprises:

(1) providing a precursor polymer comprising units of general formula in which Ar is substituted or unsubstituted arylene, L is a leaving group, $R^1$ and $R^2$ are each independently H, alkyl, alkoxy, aryl or an electron-withdrawing group, and n is an integer;

(2) reacting the precursor polymer with a reactant comprising a carboxylate, an aldehyde, a ketone, a sulphonate, a thioate, a disulphide, a xanthate, an amine, a pyridine, a hydrazide, a phenoxide, an alcohol with a boiling point above 100° C., or a derivative thereof, under substitution conditions whereby a proportion of the leaving groups are substituted to form a substituted precursor copolymer comprising units of general formula $-(ArCHR^1-CR^2L)_m-(ArCHR^1-CR^2X)_l-$, in which Ar, $R^1$, $R^2$ and L are as defined above, X is a substituent group from the reactant, l and m are independently integers; and (3) converting the substituted precursor copolymer to a conjugated poly(arylene vinylene) copolymer by elimination of the leaving groups from the substituted precursor copolymer.

Throughout this specification, the term arylene is intended to include in its scope all types of arylenes including heteroarylenes as well as arylenes incorporating more than one ring structure, including fused ring structures. Ar may be paraphenylene, 1,4 naphthylene, 1,4 anthracene, 2,6 fluorene and is preferably paraphenylene.

$R^1$ and $R^2$ may be independently selected from $C_1-C_{10}$ alkyl, $C_1-C_{10}$ alkoxy, aryl such as substituted or unsubstituted phenyl, heterocyclic or polycyclic aryl, —CN or —$CF_3$. Preferably both $R^1$ and $R^2$ are H.

Where the reactant comprises a carboxylate, a carboxylate salt is preferred. In this way, the precursor polymer may be made conventionally such as by base-catalysed polymerisation from suitable monomers such as paraxylylene bis (tetrahydrothiophenium bromide). The carboxylate salt is then added to the precursor polymer. Other suitable monomers are described in U.S. Pat. No. 5,401,827.

Advantageously, the precursor polymer may be provided by base-catalysed polymerisation from suitable monomers in a molar excess of base. In this way, the carboxylate salt is formed by neutralisation of the base with its corresponding carboxylic acid. One advantage of this method is that it can be carried out in a single reaction zone such as a suitable container, in which the precursor polymer is formed in the excess base and, after polymerisation is complete, neutralisation takes place so as to form the substituted precursor copolymer prior to conversion into the conjugated poly (arylene vinylene) copolymer.

The carboxylate may be aliphatic such as formate or acetate and may be formed by the corresponding aliphatic carboxylic acids, formic acid or acetic acid. Substituted or unsubstituted aromatic carboxylates may be used such as those formed from 2,6 dimethylbenzoic acid, as well as derivatives thereof.

Materials of the following general formulae may be used:

where R'=(cyclo)alkyl chain, Ar'=substituted or unsubstituted aromatic or polycyclic system.

In a further embodiment of this invention the substitution approach may be facilitated by the interaction of precursor polymer with a basic solution of a ketone or aldehyde (ie carbonyl) based system. Typical carbonyl based systems have the general structure shown and would include benzaldehyde, anthraldehyde, and benzophenone:

in which $R^3$ and $R^4$ are each independently R' or Ar' as defined above.

In a further embodiment of this invention oxygen, sulphur and nitrogen nucleophiles may be used to form PPV precursor copolymers. A two-stage synthesis involves precursor polymer preparation followed by treatment with alcohols or alkoxides, thiols or thiolates, or amines( for example diphenylamine) etc. Following this the solution must be neutralised in the normal way using an inorganic acid such as HCl or HBr or by using one of the carboxylic acids listed above.

Oxygen nucleophiles would include sulphonic acids, phenoxide, alcohols, and derivatives thereof. Where alcohols are used they should have a low volatility so that, under thermal conversion to form conjugated copolymer, significant loss of alcohol does not occur.

Sulphur-containing nucleophiles would also include thioacids, disulphides, xanthates, and derivatives thereof.

Nitrogen nucleophiles would include primary, secondary, and tertiary aliphatic or aromatic amines, pyridines, hydrazides, and derivatives thereof.

Converting step (3) is generally carried out at a temperature in the range 80° C. to 350° C., usually around 150° C. at a time in the range 30 minutes to 10 hours, preferably around 4 hours. The process according to the present invention may involve treating the precursor polymer, either before or after purification, with suitable reagents, or carrying out the polymerisation in the presence of such reagents.

Substituent group X is formed from the substitution reaction between the reactant and the precursor polymer, for example by nucleophilic substitution. The reactant may be chosen to produce group X as achemically beneficial moiety to be incorporated into the vinyl copolymer. Thus, group X may be capable of chelating or binding indium or other undesirable impurities such as catalyst residues. Examples of such reactants would include acetyl acetone or 8-hydroxyquinoline. Alternatively, copolymers may be prepared with cross-linkable groups. Such groups would be capable of cross-linking to another part of the conjugated poly(arylene vinylene) copolymer or to another polymer chain such as another chain of the poly(arylene vinylene) copolymer. In this case, substituent group X would include acrylates and cinnamates and be introduced into the polymer by neutralising the polymerisation solution with acrylic acid or cinnamic acid respectively. The level of incorporation would be determined by the amount of base used for the polymerisation.

In a further aspect of this invention, a low band gap lumophore or chromophore may be incorporated into the copolymer by nucleophilic displacement of the leaving group to yield a semiconductive copolymer containing lower band gap lumophores as compared to the copolymer. Exciton migration to the lower band gap component leads to efficient emission from the lumophore with the corresponding shift in emission spectrum Hence, this method may be used to tune the emission or absorption characteristics of PPV.

An important aspect of the present process is that the concentration of non-conjugated segments in the final copolymer may be increased to such a level that the emission spectrum is significantly blue shifted. In the extreme, blue emission is observed. This method therefore provides a highly controllable way in which to tune the emission from poly(arylene vinylene) copolymers such as PPV copolymers.

In a further aspect, there is provided a process for the production of a luminescent device comprising a conjugated poly(arylene vinylene) copolymer supported on a substrate, which process comprises preparing a conjugated poly (arylene vinylene) copolymer in accordance with the above process wherein converting step (3) is carried out on the substrate.

In a further aspect, there is provided a process for the production of an electroluminescent device comprising a first electrode, a second electrode and at least one layer between the electrodes, including a conjugated poly(arylene vinylene) copolymer layer, which process comprises preparing a conjugated poly(arylene vinylene) copolymer in accordance with the above process, wherein converting step (3) is carried out on the first electrode.

The first electrode may comprise a conductive oxide such as indium tin oxide, aluminium-doped zinc oxide, fluorine-doped tin oxide, vanadium oxide, molybdenum oxide, nickel oxide; a conducting polymer; or a metal film.

In accordance with this invention, the poly(arylene vinylene) copolymers exhibit high photoluminescent efficiencies in the presence or absence of conductive oxide substrates such as indium tin oxide.

According to another aspect of the invention there is provided a multilayer electroluminescent device of high electroluminescence efficiency, incorporating a converted precursor copolymer as the emitting layer and an underlying electrode on which the conversion process has been carried out. At least one other layer is present one of which is the second electrode. The emissive copolymer exhibits enhanced photoluminescence efficiency in the presence or absence of ITO, enhanced EL efficiency and differential stability during device driving.

EL device manufacture is typically carried out by coating of the precursor copolymer by suitable means usually at a thickness of around 100 nm onto, for example, a semi-transparent conductive oxide. The precursor copolymer film is then converted to form the semiconductive conjugated copolymer. Following this, a suitable metal electrode is deposited and, following the application of a suitable voltage, light emission is observed.

The semiconductive conjugated poly(arylene vinylene) copolymers of the present invention may be used as charge transport layers or charge injection layers or light emitting layers in luminescent devices, especially electroluminescent devices including optically or electrically pumped lasers. The polymers may also be used as polymeric fluorescent dyes.

The present invention will now be described in further detail, by way of example only, with reference to the following Examples an he accompanying drawings.

DESCRIPTION OF THE PREFERRED EMBODIMENTS

EXAMPLE 1

A specific embodiment is now described, see Table 1. One a equivalent (6.2 g) of p-xylylene bis(tetrahydrothiophenium bromide) is taken and dissolved in 120 ml 50/50 water/methanol solvent mixture. The solution is then deoxygenated for at least 20 mins with a nitrogen purge. Following this a deoxygenated solution of 5 equivalents of potassium hydroxide in 20 ml 50/50 water methanol is added to the monomer solution. When the polymerisation is complete neutralisation is carried out with 10 ml acetic acid. The product is then dialysed against 50/50 water/methanol until the dialate conductivity is <1 $\mu$S/cm. The final dialysis is then carried out against neat methanol. The product, which contains ~40 mol %. of the acetate function may now be used for the fabrication of an EL device as described below.

EXAMPLE 2

In a further specific embodiment, the proportion of acetate functionality may be altered by carrying out the synthesis as in Example 1 but using 1, 2.5 or 10 equivalents of base used for the polymerisation and then using respectively 0.9, 5 and 20 ml of acetic acid required for neutralisation. As the number of equivalents of base used for the polymerisation increases, and therefore the amount of acetate available for substitution increases, so does the acetate concentration increase in the final polymer.

EXAMPLE 3

Another specific embodiment is now described. One equivalent (6.2 g) of p-xylylene bis(tetrahydrothiophenium bromide) is taken and dissolved in 150 ml 50/50 water/methanol solvent mixture. The solution is then deoxygenated for at least 20 mins with a nitrogen purge. Following this a deoxygenated solution of 20 equivalents of potassium hydroxide in 80 ml 50/50 water methanol is added to the monomer solution. When the polymerisation is complete neutralisation is carried out with 80 ml acetic acid. The product is then dialysed against 50/50 water/methanol until the dialate conductivity is <1 $\mu$S/cm. The final dialysis is then carried out against neat methanol.

EXAMPLE 4

Another specific embodiment is now described. One equivalent (6.2 g) of p-xylylene bis(tetrahydrothiophenium bromide) is taken and dissolved in 200 ml 50/50 water/methanol solvent mixture. The solution is then deoxygenated for at least 30 mins with a nitrogen purge. Following this a deoxygenated solution of 40 equivalents of potassium hydroxide in 160 ml 50/50 water methanol is added to the monomer solution. When the polymerisation is complete neutralisation is carried out with 40 ml acetic acid. The product is then dialysed against 50/50 water/methanol until the dialate conductivity is <1 $\mu$S/cm. The final dialysis is then carried out against neat methanol.

EXAMPLE 5

Another specific embodiment is now described. One equivalent (6.2 g) of p-xylylene bis(tetrahydrothiophenium bromide) is taken and dissolved in 120 ml 50/50 water/methanol solvent mixture. The solution is then deoxygenated for at least 20 mins with a nitrogen purge. Following this a deoxygenated solution of 5 equivalents of potassium hydroxide in 20 ml 50/50 water methanol is added to the monomer solution. When the polymerisation is complete neutralisation is carried out with 8 ml formic acid. The product is then dialysed against 50/50 water/methanol until the dialate conductivity is <1 $\mu$S/cm. The final dialysis is then carried out against neat methanol. The product may now be used for the fabrication of an EL device as described below.

EXAMPLE 6

In a further specific embodiment, the proportion of formate functionality may be altered by carrying out the synthesis as in Example 5 but using 1, 2.5 or 10 equivalents of base used for the polymerisation and and then using respectively 0.8, 4 and 16 ml of formic acid required for neutralisation. As the number of equivalents of base used for the polymerisation increases , and therefore the amount of formate available for substitution increases, so does the formate concentration increase in the final polymer.

EXAMPLE 7

Another specific embodiment is now described. One equivalent (6.2 g) of p-xylylene bis(tetrahydrothiophenium bromide) is taken and dissolved in 150 ml 50/50 water/methanol solvent mixture. The solution is then deoxygenated for at least 20 mins with a nitrogen purge. Following this a deoxygenated solution of 20 equivalents of potassium hydroxide in 80 ml 50/50 water methanol is added to the monomer solution. When the polymerisation is complete neutralisation is carried out with 26 ml formic acid. The product is then dialysed against 50/50 water/methanol until the dialate conductivity is <2 $\mu$S/cm. The final dialysis is then carried out against neat methanol. The product may now be used for the fabrication of an EL device as described below.

EXAMPLE 8

Another specific embodiment is now described. One equivalent (6.2 g) of p-xylylene bis(tetrahydrothiophenium bromide) is taken and dissolved in 200 ml 50/50 water/methanol solvent mixture. The solution is then deoxygenated for at least 20 mins with a nitrogen purge. Following this a deoxygenated solution of 40 equivalents of potassium hydroxide in 160 ml 50/50 water methanol is added to the monomer solution. When the polymerisation is complete neutralisation is carried out with 56 ml formic acid. The product is then dialysed against 50/50 water/methanol until the dialate conductivity is <2 µS/cm. The final dialysis is then carried out against neat methanol. The product may now be used for the fabrication of an EL device as described below.

EXAMPLE 9

Another specific embodiment is now described. One equivalent (6.2 g) of p-xylylene bis(tetrahydrothiophenium bromide) is taken and dissolved in 220 ml 50/50 water/methanol solvent mixture. The solution is then deoxygenated for at least 20 mins with a nitrogen purge. Following this a deoxygenated solution of 80 equivalents of potassium hydroxide in 240 ml 50/50 water methanol is added to the monomer solution. When the polymerisation is complete neutralisation is carried out with 112 ml formic acid. The product is then dialysed against 50/50 water/methanol until the dialate conductivity is <2 µS/cm. The final dialysis is then carried out against neat methanol. The product may now be used for the fabrication of an EL device as described below.

EXAMPLE 10

Another specific embodiment is now described. A quantity of preformed PPV precursor (homopolymer or copolymer purified by dialysis) is taken and treated with a solution of 0.1–100 equivalents of a suitable salt system that yields appropoe nucleophilic species on dissolution. Examples of the salt would include sodium acetate, tetrabutyl ammonium acrylate, tetrabutyl ammonium cinnamate, tetrabutyl ammonium benzoate, tetrabutyl ammonium thiolacetate, sodium formate, sodium phenolate etc. The precursor polymer solution is treated with the salt solution for up to 24 hours or until the required level of substitution is obtained. Purification is then carried out by dialysis. The preformed homopolymer PPV may be synthesised in situ.

EXAMPLE 11

Another specific embodiment is now described. A quantity of preformed PPV precursor homopolymer is taken and treated with a solution of 25 equivalents of sodium acetate. The precursor polymer solution is treated with the salt solution for up to 11 hours or until the required level of substitution is obtained. Purification is then carried out by dialysis.

EXAMPLE 12

In a further specific embodiment, the proportion of acetate functionality may be altered by carrying out the synthesis as in Example 11 but using 12.2, 40, 100 and 200 equivalents of sodium acetate.

EXAMPLE 13

Another specific embodiment is now described. One equivalent (6.2 g) of p-xylylene bis(tetrahydrothiophenium bromide) is taken and dissolved in 120 ml 50/50 water/methanol solvent mixture. The solution is then for at least 20 mins with a nitrogen purge. Following this a deoxygenated solution of 5 equivalents of potassium hydroxide and 20 equivalents of potassium acetate in 100 ml 50/50 water methanol is added to the monomer solution. When the polymerisation is complete neutralisation is carried out with 10 ml acetic acid. The product is then dialysed against 50/50 water/methanol until the dialate conductivity is <1 µS/cm. The final dialysis is then carried out against neat methanol. The product may now be used for the fabrication of an EL device as described below.

EXAMPLE 14

In a further specific embodiment, the proportion of acetate functionality may be altered by carrying out the synthesis as in Example 13 but using 10 or 40 equivalents of sodium acetate.

EXAMPLE 15

Another specific embodiment is now described. One equivalent 6.2g) of p-xylylene bis(tetrahydrothiophenium bromide) is taken and dissolved in 120 ml 50/50 water/methanol solvent mixture. The solution is then for at least 20 mins with a nitrogen purge. Following this a deoxygenated solution of 5 equivalents of potassium hydroxide in 20 ml 50/50 water/methanol. When the polymerisation is complete neutralisation is carried out with 10 ml acetic acid hydroxide and 20 equivalents of potassium acetate in 50 ml 50/50 water methanol. The product is then dialysed against 50/50 water/methanol until the dialate conductivity is <1 µS/cm. The final dialysis is then carried out against neat methanol. The product may now be used for the fabrication of an EL device as described below.

EXAMPLE 16

Another specific embodiment is now described. One equivalent of p-xylylene bis(tetrahydrothiophenium bromide) is taken and dissolved in 120 ml 50/50 water/methanol solvent mixture. The solution is then deoxygenated for at least 20 mins with a nitrogen purge. Following this a deoxygenated solution of 5 equivalents of potassium hydroxide in 20 ml 50/50 water methanol is added slowly to the monomer solution. Simultaneusly, 5 equivalents of phenol are added dropwise and the solution is allowed to stir for 2 mins. When the polymerisation is complete neutralisation is carried out with 10 ml acetic acid or 20 ml HCl. The product is then dialysed against 50/50 water/methanol until the dialate conductivity is <1 µS/cm. The final dialysis is then carried out against neat methanol. The product may now be used for the fabrication of an EL device as described below.

EXAMPLE 17

In a further specific embodiment, the proportion of phenolate functionality may be increased by carrying out the synthesis as in Example 10 but using 1 or 10 equivalents of phenol. As the number of equivalents of phenol increases phenol concentration increase in the final polymer.

EXAMPLE 18

Another specific embodiment is now described. One equivalent of p-xylylene bis(tetrahydrothiophenium bromide) is taken and dissolved in 140 ml 57/43 water/methanol solvent mixture. The solution is then deoxygenated for at least 20 mins with a nitrogen purge. Following this a deoxygenated solution of 5 equivalents of potassium hydroxide in 20 ml 50/50 water methanol is added to the monomer solution. When the polymerisation is complete 1 equivalent of picric acid i.e.45 ml solution (3.4 M in water) are added and the solution is allowed to stir for 2 mins. Neutralisation is then carried out with 10 ml acetic acid. The product is then dialysed against 50/50 water/methanol until the dialate conductivity is <1 µS/cm. The final dialysis is then carried out against neat methanol. The product may now be used for the fabrication of an EL device as described below.

EXAMPLE 19

Another specific embodiment is now described. One equivalent (1.2 g) of p-xylylene bis(tetrahydrothiophenium bromide) was prepared in situ by allowing to react one equivalent of α, α-dibromo-p-xylene with 2 equivalents of tetrahydrothiophene in 10 ml of deoxygenated methanol for 16 h at 55° C. under nitrogen. 20 ml of water and 10 ml of methanol were then added. The solution is then deoxygenated for at least 20 mins with a nitrogen purge. Following this a deoxygenated solution of 5 equivalents of potassium hydroxide in 10 ml 50/50 water methanol is added to the monomer solution. When the polymerisation is complete neutralisation is carried out with 5.1 equivalents of 2,6 dimethyl benoic acid. The product is then dialysed once against 5l of 50/50 water methanol and then 3 times against 5 liters of neat methanol. The product may now be used for the fabrication of an EL device as described below.

EXAMPLE 20

Another specific embodiment is now described. One equivalent of p-xylylene bis(tetrahydrothiophenium bromide) is taken and dissolved in 120 ml 50/50 water/methanol solvent mixture. The solution is then deoxygenated for at least 20 mins with a nitrogen purge. Following this a deoxygenated solution of 5 equivalents of potassium hydroxide in 20 ml 50/50 water methanol is added to the monomer solution. When the polymerisation is complete 0.25 equivalents of diphenyl amine are added and the solution is allowed to stir for 1.5 mins. Neutralisation is then carried out with 10 ml acetic acid or 20 ml HCL. The product is then dialysed against 50/50 a water/methanol until the dialate conductivity is <1 μS/cm. The final dialysis is then carried out against neat methanol. The product may now be used for the fabrication of an EL device as described below.

EXAMPLE 21

Another specific embodiment is now described. A quantity of preformed PPV precursor acetate copolymer is taken and treated with 0.25 equivalents of diphenyl amine (10 mg). The solution was stirred at room temperature for 30 min. Purification by dialysis is not needed.

EXAMPLE 22

Another specific embodiment is now described. A quantity of preformed PPV precursor acetate copolymer is taken and treated with 0.7 equivalents of diphenyl amine (27 mg). Purification was carried out by dialysis against 2l of neat methanol.

EXAMPLE 23

Another specific embodiment is now described. One equivalent (6.2 g) of p-xylylene bis(tetrahydrothiophenium bromide) is taken and dissolved in 120 ml 50/50 water/methanol solvent mixture. The solution is then deoxygenated for at least 20 mins with a nitrogen purge. Following this a deoxygenated solution of 5 equivalents of potassium hydroxide in 20 ml 50/50 water methanol is added to the monomer solution. When the polymerisation is complete neutralisation is carried out with 12 ml of methane sulfonic acid. The product is then dialysed against 50/50 water/methanol until the dialate conductivity is <5 μS/cm. The final dialysis is then carried out against neat methanol. The product may now be used for the fabrication of an EL device as described below.

EXAMPLE 24

In a further specific embodiment, the proportion of methanesulfonate functionality may be increased by carrying out the synthesis as in Example 23 but using 10 equivalents of base used for the polymerisation and and then increasing proportionally the amount of methane sulfonic acid required for neutralisation.

EXAMPLE 25

Another specific embodiment is now described. One equivalent (3.1 g) of p-xylylene bis(tetrahydrothiophenium bromide) is taken and dissolved in 75 ml 50/50 water/methanol solvent mixture. The solution is then deoxygenated for at least 20 mins with a nitrogen purge. Following this a deoxygenated solution of 20 equivalents of potassium hydroxide in 40 ml 50/50 water methanol is added to the monomer solution. When the polymerisation is complete neutralisation is carried out with 24 ml of methane sulfonic acid. The product is then dialysed against 50/50 water/methanol until the dialate conductivity is <2 μS/cm. The final dialysis is then carried out against neat methanol. The product may now be used for the fabrication of an EL device as described below.

EXAMPLE 26

Another specific embodiment is now described. A preformed and purified precursor polymer solution is taken and treated with 0.25 eqs of methane sulphonic acid. The solution is stirred overnight (16 hrs) and following this a sulphonate based PPV copolymer is obtained and is ready for fabrication into an EL device as described below or a further purification step may be required.

EXAMPLE 27

Another specific embodiment is now described. One equivalent (6.2 g) of p-xylylene bis(tetrahydrothiophenium bromide) is taken and dissolved in 120 ml 50/50 water/methanol solvent mixture. The solution is then deoxygenated for at least 20 mins with a nitrogen purge. Following this a deoxygenated solution of 5 equivalents of potassium hydroxide in 20 ml 50/50 water methanol is added to the monomer solution. When the polymerisation is complete neutralisation is carried out with 100 ml of 0.01 M sulfuric acid. The product is then dialysed against 50/50 water/methanol until the dialate conductivity is <1 μS/cm. The final dialysis is then carried out against neat methanol. The product may now be used for the fabrication of an EL device as described below.

EXAMPLE 28

Another specific embodiment is now described. One equivalent of p-xylylene bis(tetrahydrothiophenium bromide) is taken and dissolved in 120 ml 50/50 water/methanol solvent mixture. The solution is then deoxygenated for at least 20 mins with a nitrogen purge. Following this a deoxygenated solution of 5 equivalents of potassium hydroxide in 20 ml 50/50 water methanol is added to the monomer solution. When the polymerisation is complete 1 equivalent of hydroxy coumarin slurry in 27 ml of methanol are added and the solution is allowed to stir for 2 mins. Neutralisation is then carried out with 10 ml acetic acid or 20 ml HCl. The product is then dialysed against 50/50 water/methanol until the dialate conductivity is <2 μS/cm. The final dialysis is then carried out against neat methanol. The product may now be used for the fabrication of an EL device as described below.

EXAMPLE 29

Another specific embodiment is now described. One equivalent of p-xylylene bis(tetrahydrothiophenium bromide) is taken and dissolved in 120 ml 50/50 water/ methanol solvent mixture. The solution is then deoxygenated for at least 20 mins with a nitrogen purge. Following this a deoxygenated solution of 5 equivalents of potassium hydroxide in 20 ml 50/50 water methanol is added to the monomer solution. When the polymerisation is complete 1 equivalent of benzaldehyde are added and the solution is allowed to stir for 2 mins. Neutralisation is then carried out with 10 ml acetic acid or 20 ml HCl. The product is then dialysed against 50/50 water/methanol until the dialate conductivity is <1 $\mu$S/cm. The final dialysis is then carried out against neat methanol. The product may now be used for the fabrication of an EL device as described below.

EXAMPLE 30

In a further specific embodiment, the proportion of carbonyl may be increased by carrying out the synthesis as in Example 29 but using 0.33 or 2 equivalents of benzaldehyde used.

EXAMPLE 31

Another specific embodiment is now described. One equivalent of p-xylylene bis(tetrahydrothiophenium bromide) is taken and dissolved in 140 ml 33/67 water/methanol solvent mixture. The solution is then deoxygenated for at least 20 mins with a nitrogen purge. Following this a deoxygenated solution of 5 equivalents of potassium hydroxide in 40 ml 12/88 water methanol is added to the monomer solution. When the polymerisation is complete 1.3 equivalent of benzophenone are added in 70 ml methanol and the solution is allowed to stir for 20 seconds. Neutralisation is then carried out with 10 ml acetic acid. The product is then dialysed against 50/50 water/methanol until the dialate conductivity is <1 $\mu$S/cm. The final dialysis is then carried out against neat methanol. The product may now be used for the fabrication of an EL device as described below.

EXAMPLE 32

Another specific embodiment is now described. One equivalent of p-xylylene bis(tetrahydrothiophenium bromide) is taken and dissolved in 120 ml 50/50 water/methanol solvent mixture. The solution is then deoxygenated for at least 20 mins with a nitrogen purge. Following this a deoxygenated solution of 5 equivalents of potassium hydroxide in 20 ml 50/50 water methanol is added to the monomer solution. When the polymerisation is complete 0.03 equivalents of antracene aldehyde dissolved in 30 ml of methanol are added and the solution is allowed to stir for 2 mins. Neutralisation is then carried out with 10 ml acetic acid. The product is then dialysed against 50/50 water/methanol until the dialate conductivity is <1 $\mu$S/cm. The final dialysis is then carried out twice against neat methanol. The product may now be used for the fabrication of an EL device as described below.

EXAMPLE 33

Another specific embodiment is now described. A quantity of preformed PPV precursor acetate copolymer is taken and treated with a solution of 0.14 equivalents of antracene aldehyde. Purification is carried out by dialysis.

EXAMPLE 34

Another specific embodiment is now described. One equivalent of p-xylylene bis(tetrahydrothiophenium bromide) is taken and dissolved in 120 ml 50/50 water/methanol solvent mixture. The solution is then deoxygenated for at least 20 mins with a nitrogen purge. Following this a deoxygenated solution of 5 equivalents of potassium hydroxide in 20 ml 50/50 water methanol is added to the monomer solution. When the polymerisation is complete 5 equivalents of acetylacetone dissolved in 30 ml of methanol are added and the solution is allowed to stir for 2.5 mins. Neutralisation is then carried out with 3 ml acetic acid. The product is then dialysed against 50/50 water/methanol until the dialate conductivity is <1 $\mu$S/cm. The final dialysis is then carried out against neat methanol. The product may now be used for the fabrication of an EL device as described below.

EXAMPLE 35

Another specific embodiment is now described. One equivalent of p-xylylene bis(tetrahydrothiophenium bromide) is taken and dissolved in 120 ml 50/50 water/methanol solvent mixture. The solution is then deoxygenated for at least 20 mins with a nitrogen purge. Following this a deoxygenated solution of 5 equivalents of potassium hydroxide in 20 ml 50/50 water methanol is added to the monomer solution. When the polymerisation is complete 5 equivalents of 3, methyl, 2,4 pentanedione dissolved in 30 ml of methanol are added and the solution is allowed to stir for 2.5 mins. The product is then dialysed against 50/50 water/methanol until the dialate conductivity is <1 $\mu$S/cm. The final dialysis is then carried out against neat methanol. The product may now be used for the fabrication of an EL device as described below.

EXAMPLE 36

Another specific embodiment is now described. One equivalent (6.2 g) of p-xylylene bis(tetrahydrothiophenium bromide) is taken and dissolved in 120 ml 50/50 water/methanol solvent mixture. The solution is then deoxygenated for at least 20 mins with a nitrogen purge. Following this a deoxygenated solution of 5 equivalents of potassium hydroxide in 20 ml 50/50 water methanol is added to the monomer solution. When the polymerisation is complete neutralisation is carried out with 12 ml acrylic acid. The product is then dialysed against 50/50 water/methanol until the dialate conductivity is <1 $\mu$S/cm. The final dialysis is then carried out against neat methanol. The product may now be used for the fabrication of an EL device as described below.

EXAMPLE 37

In a further specific embodiment, the proportion of acrylate functionality may be altered by carrying out the synthesis as in Example 36 but using 10 equivalents of base used for the polymerisation and and then using respectively 24 ml of acrylic acid for neutralisation. As the number of equivalents of base used for the polymerisation increases, and therefore the amount of acrylate available for substitution increases, so does the acrylate concentration increase in the final polymer.

EXAMPLE 38

Another specific embodiment is now described. One equivalent (6.2 g) of p-xylylene bis(tetrahydrothiophenium bromide) is taken and dissolved in 150 ml 50/50 water/methanol solvent mixture. The solution is then deoxygenated for at least 20 mins with a nitrogen purge. Following this a deoxygenated solution of 20 equivalents of potassium hydroxide in 80 ml 50/50 water methanol is added to the monomer solution. When the polymerisation is complete neutralisation is carried out with 45.7 ml acrylic acid. The product is then dialysed against 50/50 water/methanol until the dialate conductivity is <1 $\mu$S/cm. The final dialysis is then carried out against neat methanol. The product may now be used for the fabrication of an EL device as described below.

EXAMPLE 39

Another specific embodiment is now described. A quantity of preformed PPV precursor homopolymer is taken and treated with a solution of 25 equivalents of an acrylate salt. The precursor polymer solution is treated at room temperature with the salt solution for up to 11 hours or until the required level of substitution is obtained. Purification is then carried out by dialysis.

EXAMPLE 40

Another specific embodiment is now described. One equivalent (6.2 g) of p-xylylene bis(tetrahydrothiophenium bromide) is taken and dissolved in 120 ml 50/50 water/methanol solvent mixture. The solution is then for at least 20 mins with a nitrogen purge. Following this a deoxygenated solution of 1 equivalents of potassium hydroxide in 4 ml 50/50 water methanol is added to the monomer solution. When the polymerisation is complete a deoxygenated solution of 9 equivalents of potassim acrylate and 1 equivalent of acrylic acid in 50 ml 50/50 water/methanol is added. The product is then dialysed against 50/50 water/methanol until the dialate conductivity is <1 $\mu$S/cm. The final dialysis is then carried out against neat methanol. The product may now be used for the fabrication of an EL device as described below.

EXAMPLE 41

In a further specific embodiment, the proportion of acrylate functionality may be increased by carrying out the synthesis as in Example 40 but using 19 equivalents of potassium acrylate. As the number of equivalents of acrylate increases acrylate concentration increase in the final polymer.

EXAMPLE 42

Another specific embodiment is now described. One equivalent (6.2 g) of p-xylylene bis(tetrahydrothiophenium bromide) is taken and dissolved in 180 ml 33/67 water/methanol solvent mixture. The solution is then deoxygenated for at least 20 mins with a nitrogen purge. Following this a deoxygenated solution of 5 equivalents of potassium hydroxide in 40 ml 50/50 water methanol is added to the monomer solution. When the polymerisation is complete neutralisation is carried out with 5.8 equivalents of cinnamic acid dissolved in 120 ml of methanol. The product is then dialysed once against mrthanol then against 50/50 water/methanol until the dialate conductivity is <1 $\mu$S/cm. The final dialysis is then carried out against neat methanol. The product may now be used for the fabrication of an EL device as described below.

EXAMPLE 43

Another specific embodiment is now described. One equivalent (6.2 g) of p-xylylene bis(tetrahydrothiophenium bromide) is taken and dissolved in 180 ml 33/67 water/methanol solvent mixture. The solution is then for at least 20 mins with a nitrogen purge. Following this a deoxygenated solution of 5 equivalents of potassium hydroxide and 20 equivalents of potassium cinnamate in 160 ml 12/88 water methanol is added to the monomer solution. When the polymerisation is complete neutralisation is carried out with 5.0 equivalents of cinnamic acid dissolved in 100 ml of methanol. The produce is then dialysed against 50/50 water/methanol until the dialate conductivity is <1 $\mu$S/cm. The final dialysis is then carried out against neat methanol. The product may now be used for the fabrication of an EL device as described below.

EXAMPLE 44

Another specific embodiment is now described. A quantity of preformed PPV precursor homopolymer is taken and treated with a solution of 25 equivalents of an cinnamate salt. The precursor polymer solution is treated with the salt solution for up to 10 hours or until the required level of substitution is obtained. Purification is then carried out by dialysis.

EXAMPLE 45

Another specific embodiment is now described. One equivalent of p-xylylene bis(tetrahydrothiophenium bromide) is taken and dissolved in 160 ml 37/63 water/methanol solvent mixture. The solution is then deoxygenated for at least 20 mins with a nitrogen purge. Following this a deoxygenated solution of 5 equivalents of potassium hydroxide and 1 equivalent of 8-hydroxyquinoline in 70 ml 15/85 water methanol is added to the monomer solution. When the polymerisation is complete neutralisation is then carried out with 10 ml acetic acid. The product is then dialysed against 50/50 water/methanol until the dialate conductivity is <1 $\mu$S/cm. The final dialysis is then carried out against neat methanol. The product may now be used for the fabrication of an EL device as described below.

EXAMPLE 46

Another specific embodiment is now described. One equivalent of preformed acetate copolymer is mixed with 29.5 equivalents of glycerol and 51.3 equivalents of diethylene glycol. Coat by suitable means the precursor PPV solution at a thickness of 100 nm (after conversion) onto a semi-transparent conductive oxide. The precursor PPV copolymer film is then converted at 150° C. for 4 hours under nitrogen. The product may now be used for the fabrication of an EL device after a suitable metal electrode is deposited as described below.

EXAMPLE 47

Referring to FIG. 2, device manufacture is carried out by coating by spin-coating the substituted precursor copolymer at a thickness of 100 nm after conversion onto a semi-transparent indium tin oxide layer 2 on a glass substrate 1. The precursor copolymer film 3 is then converted a 150° C. for 4 hours. Following this, a calcium electrode 6 is deposited by thermal evaporation and, following the application of a suitable voltage (5V), light emission is observed. Additional polymer layers 3 and 5 may be applied during manufacture of the device to act as charge transport layers.

TABLE 1

| BrPPV monomer (A) | solvent W-MeOH | Temp. °C. | KOH:A mol. ratio | KOH conc. | Substituant (S) | Type | A:S mol. ratio | Neutralising acid | amount of acid | 100 a/n | PL efficiency (%) on Glass/ on ITO |
|---|---|---|---|---|---|---|---|---|---|---|---|
| 6.2 g | 120 ml | 20 | 5 | 3.75M | none le homopolymer | | — | HCl (10 N) | 10 ml | −20 | 10/1.5 |
| 6.2 g | 120 ml | 20 | 5 | 3.75M | acetate | I | — | Acetic Ac. (glacial) | 10 ml | — | 55/2 |
| 6.2 g | 120 ml | 20 | 10 | 7.5M | acetate | I | — | Acetic Ac. (glacial) | 20 ml | — | 57/20 |
| 6.2 g | 150 ml | 12 | 20 | 3.75M | acetate | I | — | Acetic Ac. (glacial) | 40 ml | — | 57/29 |
| 6.2 g | 200 ml | 12 | 40 | 3.75M | acetate | I | — | Acetic Ac. (glacial) | 80 ml | — | 50/30 |
| 6.2 g | 120 ml | 20 | 5 | 3.75M | formate | I | — | Formic Ac. (99%) | 7 ml | — | 40/2* |
| 6.2 g | 150 ml | 12 | 20 | 3.75M | formate | I | — | Formic Ac. (99%) | 30 ml | — | 55/27* |
| 2.1 g | 40 ml | 20 | 5 | 2.5M | dimethylbenzoate | I | — | dimethylbenzoic acid | 3.7 g | — | 59/22* |
| 6.2 g | 120 ml | 20 | 5 | 3.75M | phenolate | II | 1:1 | Acetic Ac. (glacial) | 10 ml | — | 62/29* |
| 6.2 g | 120 ml | 20 | 5 | 3.75M | phenolate | II | 1:5 | Acetic Ac. (glacial) | 10 ml | — | 62/38* |
| 6.2 g | 120 ml | 20 | 5 | 3.75M | methanesulfonate | II | — | Methane sulfonic acid | 12 ml | — | 10/1.5* |
| 3.1 g | 75 ml | 12 | 20 | 3.75M | methanesulfonate | II | — | Methane sulfonic acid | 24 ml | — | 14/2* |
| 6.2 g | 120 ml | 20 | 5 | 3.75M | sulfonate | II | — | Sulfuric Ac. (0.01 M) | 100 ml | — | 10/1.5* |
| 6.2 g | 120 ml | 20 | 5 | 3.75M | coumarin oxyde | II | 1:1 | Acetic Ac. (glacial) | 10 ml | — | 45/18* |
| 6.2 g | 120 ml | 20 | 5 | 3.75M | diphenylamine | II | 3:1 | Acetic Ac. (glacial) | 10 ml | — | 48/2* |
| 6.2 g | 120 ml | 20 | 5 | 3.75M | diphenylamine | II | 1:1 | Acetic Ac. (glacial) | 10 ml | — | 54/4* |
| 6.2 g | 120 ml | 20 | 5 | 3.75M | benzaldehyde | III | 3:1 | Acetic Ac. (glacial) | 10 ml | — | 60/32* |
| 6.2 g | 120 ml | 20 | 5 | 3.75M | benzaldehyde | III | 1:1 | Acetic Ac. (glacial) | 10 ml | — | 65/37* |
| 6.2 g | 120 ml | 20 | 5 | 3.75M | benzaldehyde | III | 1:1 | HCl (10 N) | 20 ml | — | 18/2* |
| 6.2 g | 120 ml | 20 | 5 | 3.75M | benzaldehyde | III | 1:2 | HCl (10 N) | 20 ml | — | 50/4* |
| 6.2 g | 120 ml | 20 | 5 | 3.75M | anthracenealdehyde | III | 7:1 | Acetic Ac. (glacial) | 10 ml | — | 55/3* |
| 6.2 g | 120 ml | 20 | 5 | 3.75M | acetylacetonate | IV | 1:5 | Acetic Ac. (glacial) | 3 ml | — | 50/18* |
| 6.2 g | 150 ml | 12 | 20 | 3.75M | aceylate | V | — | Acrylic Ac. (99%) | 47 ml | — | 55/30* |

Type I: carboxylate;
Type II: O,S,N nucleophiles;
Type III: carbonyles;
Type IV: miscellaneous;
Type V: crosslinking.
*: Indirect measurement carried out using a calibration curve.

What is claimed is:

1. A process for the preparation of a conjugated poly (arylene vinylene) copolymer for use in a luminescent device, which comprises:
   (1) providing a precursor polymer comprising units of general formula (—Ar CHR$^1$—CR$^2$L—)$_n$, in which Ar is substituted or unsubstituted arylene, L is a leaving group, R$^1$ and R$^2$ are each independently selected from the group consisting of H, alkyl, alkoxy, aryl and an electron-withdrawing group, and n is an integer;
   (2) reacting the precursor polymer with a reactant comprising a residue selected from the group consisting of a carboxylate, an aldehyde, a ketone, an amine, and a derivative thereof, under substitution conditions whereby a proportion of the leaving groups are substituted to form a substituted precursor copolymer comprising units of general formula (—Ar CHR$^1$—CR$^2$L—)$_m$(—Ar CHR$^1$—CR$^2$X—)$_l$, in which Ar, R$^1$, R$^2$ and L are as defined above, X is a substituent group from the reactant, l and m are independently integers; and
   (3) converting the substituted precursor copolymer to a conjugate poly(arylene vinylene) copolymer by elimination of the leaving groups from the substituted-precursor copolymer.

2. A process according to claim 1, wherein R$^1$ and R$^2$ are both H.

3. A process according to claim 1 or claim 2, wherein the reactant comprises a carboxylate salt.

4. A process according to claim 3, wherein the precursor polymer is provided by base-catalysed polymerisation from suitable monomers and the carboxylate salt is added to the precursor polymer.

5. A process according to claim 3, wherein the precursor polymer is provided by base-catalysed polymerisation from suitable monomers in a molar excess of base and the carboxylate salt is formed by neutralisation of the base with the corresponding carboxylic acid.

6. A process according to claim 1 or claim 2, wherein the carboxylate is $C_1$–$C_{10}$ aliphatic.

7. A process according to claim 6, wherein the aliphatic carboxylate is formate or acetate.

8. A process according to claim 1 or claim 2, wherein the carboxylate is aromatic.

9. A process according to claim 8, wherein the aromatic carboxylate is 2,6-dimethyl benzoate.

10. A process according to claim 1 or claim 2, wherein the reactant comprises a basic solution of a compound selected from the group consisting of an aldehyde and a ketone.

11. A process according to claim 10, wherein the aldehyde or ketone is selected from the group consisting of benzaldehyde, anthraldehyde and benzophenone.

12. A process according to claim 1 or claim 2, wherein group X is capable of chelating or binding indium.

13. A process according to claim 12, wherein the reactant comprises a compound selected from the group consisting of acetyl acetone and 8-hydroxyquinoline.

14. A process according to claim 1 or claim 2, wherein the group X comprises a lumophore.

15. A process according to claim 1 or claim 2, wherein group X is capable of cross-linking to another part of the conjugated poly(arylene vinylene) copolymer or to another polymer chain.

16. A process according to claim 15, wherein the reactant to form group X is an acrylate or a cinnamate.

17. A process according to claim 1 or claim 2, wherein Ar is p-phenylene.

18. A process for the production of a luminescent device comprising a conjugated poly(arylene vinylene) copolymer supported on a substrate, which process comprises preparing a conjugated poly(arylene vinylene) copolymer in accordance with the process of claim 1 or claim 2 wherein converting step (3) is carried out on the substrate.

19. A process for the production of an electroluminescent device comprising a first electrode, a second electrode and at least one layer between the electrodes, including a conjugated poly(arylene vinylene) copolymer layer, which process comprises preparing a conjugated poly(arylene vinylene) copolymer in accordance with the process of claim 1 or claim 2, wherein converting step (3) is carried out on the first electrode.

20. A process according to claim 19, wherein the first electrode comprises a conductive metal oxide.

21. A conjugated poly(arylene vinylene) copolymer for use in a luminescent device, which is obtained by a process according to claim 1 or claim 2.

22. A luminescent device obtained from a process according to claim 18.

23. An electroluminescent device obtained from a process according to claim 19.

24. An electroluminescent device obtained from a process according to claim 20.

* * * * *

UNITED STATES PATENT AND TRADEMARK OFFICE
CERTIFICATE OF CORRECTION

PATENT NO.    : 6,423,428 B1
DATED         : July 23, 2002
INVENTOR(S)   : Towns et al.

It is certified that error appears in the above-identified patent and that said Letters Patent is hereby corrected as shown below:

<u>Title page,</u>
Item [57], ABSTRACT,
Line 18, "$R_1$" should read -- $R^1$ --.

Signed and Sealed this

Thirty-first Day of December, 2002

JAMES E. ROGAN
*Director of the United States Patent and Trademark Office*